(12) United States Patent
Hshieh

(10) Patent No.: US 7,592,650 B2
(45) Date of Patent: Sep. 22, 2009

(54) HIGH DENSITY HYBRID MOSFET DEVICE

(75) Inventor: Fwu-Iuan Hshieh, Saratoga, CA (US)

(73) Assignee: M-MOS Semiconductor Sdn. Bhd. (MY)

( * ) Notice: Subject to any disclaimer, the term of this patent is extended or adjusted under 35 U.S.C. 154(b) by 418 days.

(21) Appl. No.: 11/223,621

(22) Filed: Sep. 11, 2005

(65) Prior Publication Data

US 2006/0273383 A1    Dec. 7, 2006

Related U.S. Application Data

(63) Continuation-in-part of application No. 11/147,075, filed on Jun. 6, 2005, now abandoned.

(51) Int. Cl.
    *H01L 29/74*    (2006.01)
(52) U.S. Cl. ............... 257/226; 257/123; 257/E31.096; 257/E27.137; 257/E27.144
(58) Field of Classification Search ............... 257/341, 257/294, 123, 226, E31.096, E27.137, E27.144, 257/E27.161, E25.029, E21.397
    See application file for complete search history.

(56) References Cited

U.S. PATENT DOCUMENTS

| 6,049,108 | A | * | 4/2000 | Williams et al. | ............ 257/341 |
| 6,104,049 | A | * | 8/2000 | Solayappan et al. | ......... 257/295 |

\* cited by examiner

*Primary Examiner*—Leonardo Andújar
*Assistant Examiner*—Monica D Harrison
(74) *Attorney, Agent, or Firm*—Bo-In Lin

(57) ABSTRACT

A hybrid semiconductor power device that includes a plurality of closed power transistor cells each surrounded by a first and second trenched gates constituting substantially a closed cell and a plurality of stripe cells comprising two substantially parallel trenched gates constituting substantially an elongated stripe cell wherein the closed cells and stripe cells constituting neighboring cells sharing trenched gates disposed thereinbetween as common boundary trenched gates. The closed MOSFET cell further includes a source contact disposed substantially at a center portion of the closed cell wherein the trenched gates are maintained a critical distance (CD) away from the source contact.

33 Claims, 13 Drawing Sheets

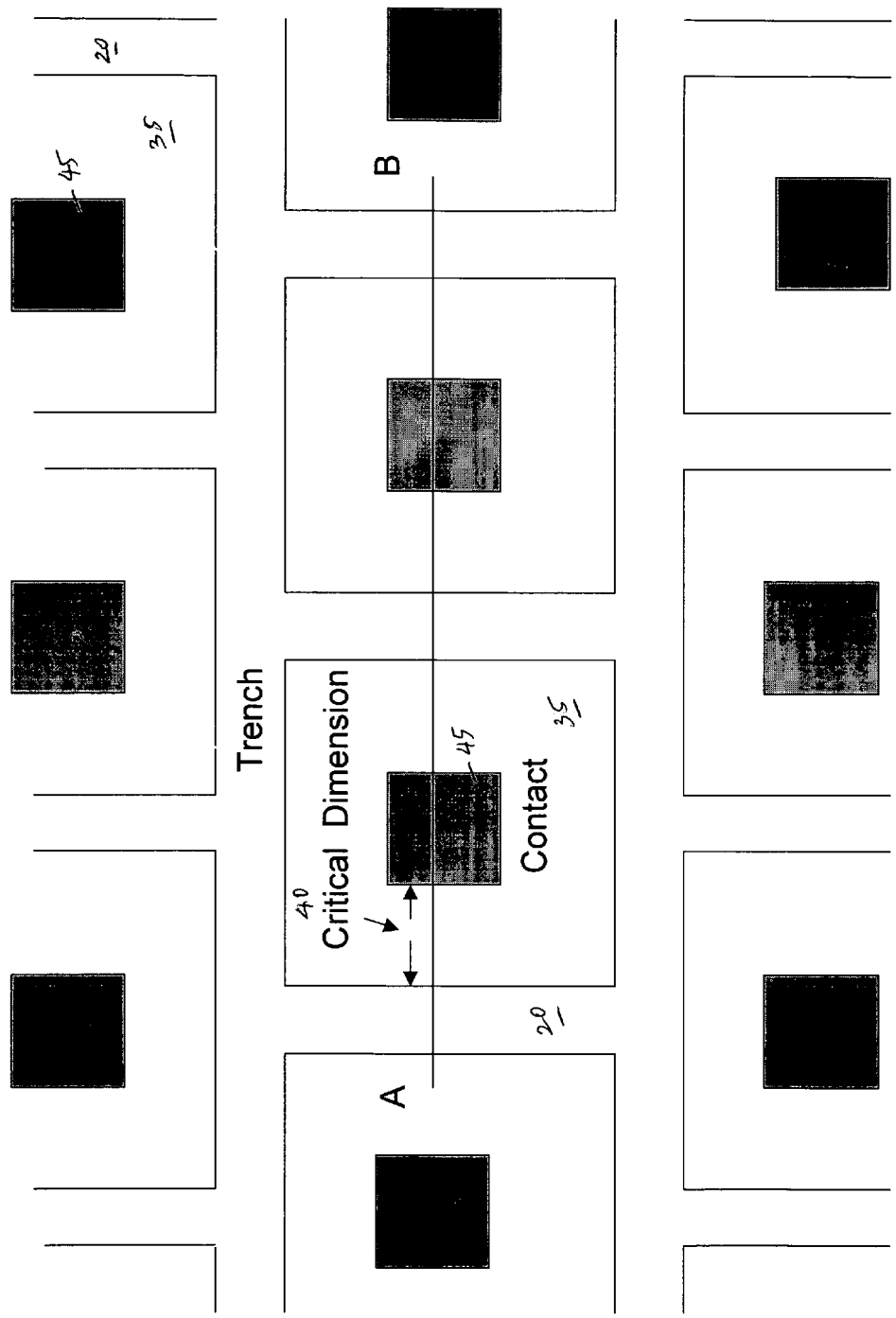

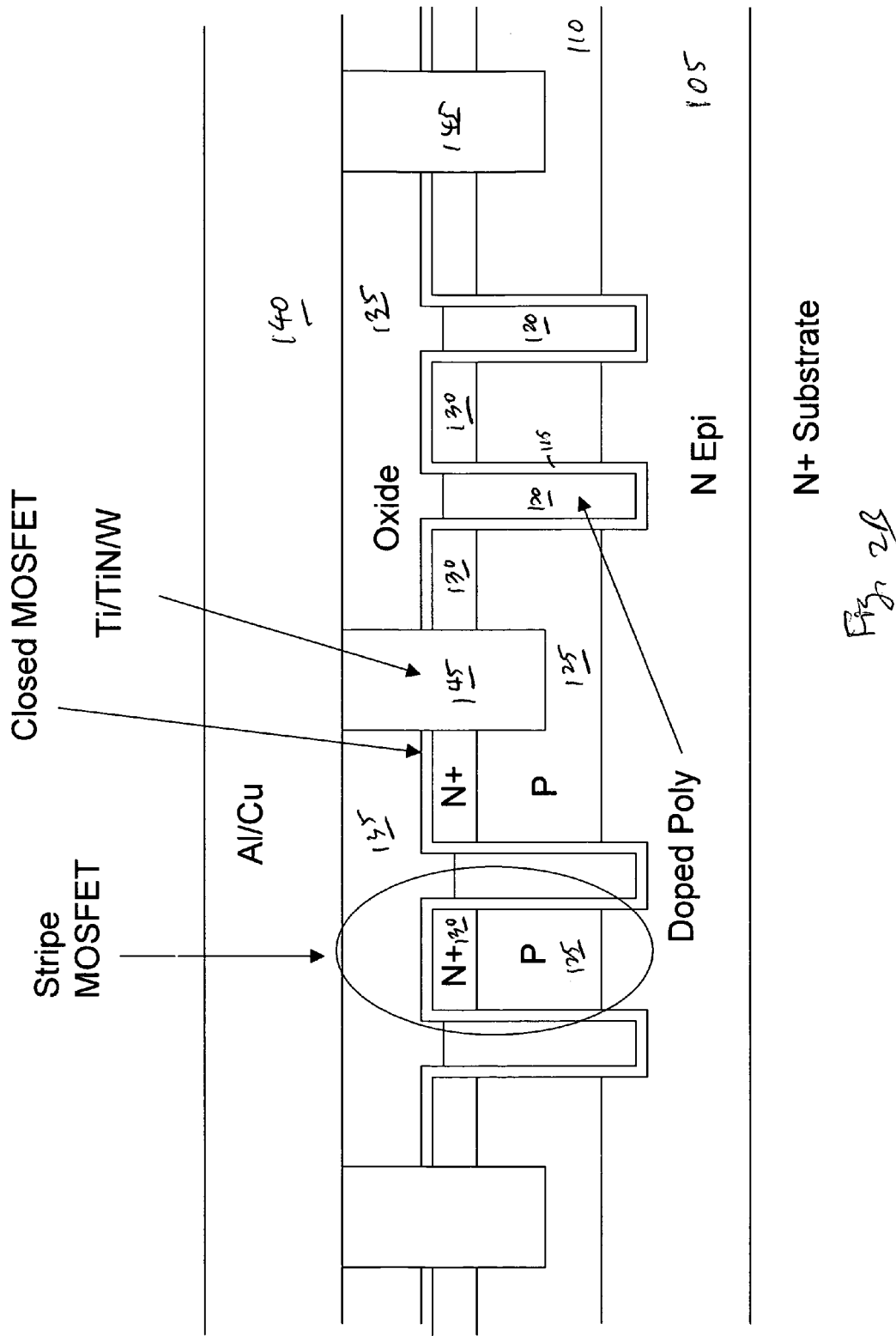

HIGH DENSITY HYBRID MOSFET DEVICE

This Patent application is a Continuation in Part (CIP) Application of application Ser. No. 11/147,075 filed by a common Inventor of this Application on Jun. 6, 2005 now abandoned with a Serial Number. The Disclosures made in that Application is hereby incorporated by reference.

BACKGROUND OF THE INVENTION

1. Field of the Invention

This invention relates generally to the cell structure, device configuration and fabrication process of power semiconductor devices. More particularly, this invention relates to a novel and improved cell structure, device configuration and improved process for fabricating a trenched semiconductor power device with improved increased cell density by reducing a gate to source contact critical dimension (CD) requirement.

2. Description of the Related Art

As the cell density of the semiconductor power devices increases, several critical dimensions (CDs) such as the distance between the contact and the trench becomes a limiting factor. Specifically, the distance between the contact and the trench is to prevent an electrical short between the gate and the source. In a trenched MOSFET cell when a non-self aligned process is applied to manufacture the trench and the source contact, a misaligned tolerance must be provided to assure that there is no contact between the source contact and the trenched gate. However, the when a greater distance between the trenched gate and the source contact is applied to accommodate potential misalignment, the cell density of the semiconductor power device is limited to about $600M/in^2$ (six hundred million cells per square inch).

More specifically, the Applicant has filed another patent application Ser. No. 11/147,075 on Jun. 6, 2005 to improve the cell density by reducing the distance between the source contacts. An improved configuration of a MOSFET device is shown in FIGS. 1A and 1B wherein the distance between the source contacts are reduced by placing the source contact 45 in the source-body contact trenches opened in an oxide layer 35. As shown in FIG. 1B, the source-body contact trenches 45 extends into the body regions 25 thus contacting both the source regions 30 and the body regions 25 to provide improved and more reliable electric contacts. However, due to the concerns of misalignment, the source body contact trenches 45 must be opened with a minimum critical distance (CD) 40 away from the trenched gate 20 to prevent inadvertent electric contact between the source contact and the gate 20. The minimum CD requirement thus limits the further reducing of the cell dimensions. As that shown in FIGS. 1A and 1B, even with reduced distance between source contacts cell density of the MOSFET device the cell density is limited to approximately $600M/in^2$ (six hundred million cells per square inch). Further increase of cell density is very difficult due to this CD requirement to maintain a minimum distance between the source body contact trench 0 and the trenched gate 20.

Therefore, there is still a need in the art of the semiconductor device fabrication, particularly for trenched power MOSFET design and fabrication, to provide a novel cell structure, device configuration and fabrication process that would resolve these difficulties and design limitations. Specifically, it is desirable to maintain low gate resistance and in the meanwhile, it is further desirable to overcome the problems above discussed difficulties such that further increase of cell density of a trenched semiconductor power device can be achieved.

SUMMARY OF THE PRESENT INVENTION

It is therefore an object of the present invention to provide new and improved semiconductor power device configuration, e.g., a MOSFET device that comprises hybrid cells. The hybrid cells are implemented with closed MOSFET cells and stripe MOSFET cells with the closed MOSFET cells surrounded by trenched gates with a trenched source body contact disposed in the center to comply with the critical dimension requirement for maintaining a minimum distance between the trenched gates and the source contacts. The stripe MOSFET cells are formed as elongated cell with trenched gates extended on both sides of the cells without a source contact while still providing current conduction function thus significant increase the cell density and meanwhile reducing the source to drain resistance. With the hybrid configuration disclosed in this invention the above-discussed limitations are therefore resolved.

Another aspect of the present invention is a combination of hybrid cell configuration including a plurality of closed MOSFET cell and stripe MOSFET cells and meanwhile by implementing the source contact plug filling into the source-body contract trenches, the cell density is increased up to 2.5 $G/in^2$ and the drain to source resistance is reduced from approximately 0.4 ohms to 0.3 ohms.

Another aspect of the present invention is to further reduce the resistance by forming the stripe cell as AccuFET cell by applying a special body implant mask to block the body dopant from entering into the stripe cells.

Briefly, in a preferred embodiment, the present invention discloses a hybrid semiconductor power device that includes a plurality of closed power transistor cells each surrounded by a first and second trenched gates constituting substantially a closed cell and a plurality of stripe cells comprising two substantially parallel trenched gates constituting substantially an elongated stripe cell wherein the closed cells and stripe cells constituting neighboring cells sharing trenched gates disposed thereinbetween as common boundary trenched gates. In a preferred embodiment, the closed MOSFET cell further comprising a source contact disposed substantially at a center portion of the closed cell wherein the trenched gates maintaining a critical distance (CD) away from the source contact. In a preferred embodiment, the source contact further constituting a trenched source contact comprising a source contact plug filling in a source-body contact trench opened in an insulation layer covering the closed cell and the source-body contact trench further extended into a source region below the insulation layer and a body region below the source region extended between the first and second trenched gates of the closed cell. In a preferred embodiment, the semiconductor power device further includes a drain electrode disposed below the body region for transmitting a source to drain current. In a preferred embodiment, the semiconductor power device further includes a source metal layer disposed above the insulation layer and electrically contacts the source contact plug. In a preferred embodiment, the source contact plug further comprising a Ti/TiN barrier layer surrounding a tungsten core as a source-body contact metal. In a preferred embodiment, the semiconductor power device further includes a thin resistance-reduction conductive layer disposed on a top surface covering the insulation layer and contacting the source contact plug whereby the resistance-reduction conductive layer having a greater area than a top surface of the contact metal plug for reducing a source-body resistance. In a preferred embodiment, the hybrid semiconductor power device further comprises a N-channel MOSFET cell. In a preferred embodiment, the hybrid semiconductor power device further comprises a P-channel MOSFET cell. In a preferred embodiment, the stripe cell further comprises a stripe AccuFET cell.

This invention further discloses a method of manufacturing a hybrid semiconductor power device that includes a step of forming a plurality of closed power transistor cells each surrounded by a first and second trenched gates constituting substantially a closed cell and forming a plurality of stripe cells comprising two substantially parallel trenched gates constituting substantially an elongated stripe cell wherein the closed cells and stripe cells are manufactured as neighboring cells sharing trenched gates disposed thereinbetween as common boundary trenched gates. The method further includes a step of disposing a source contact substantially at a center portion of the closed cell and maintaining the trenched gates at a critical distance (CD) away from the source contact. In a preferred embodiment, the method further includes a step of disposing a source contact substantially at a center portion of the closed cell by opening a source-body contact trench in an insulation layer covering the closed semiconductor power device and extending the source-body contact trench into a source region below the insulation layer and into a body region below the source region and filling the source body contract trench with a source contact plug. The method further includes a step of disposing a drain electrode below the body region for transmitting a source to drain current. The method further includes a step of disposing a source metal layer above the insulation layer and electrically contact the source contact plug. In a preferred embodiment, the step of filling the source body contact trench with a source contact plug further comprising a step of filling source body contact trench with a Ti/TiN barrier layer surrounding a tungsten core. In a preferred embodiment, the method further includes a step of disposing a thin resistance-reduction conductive layer on a top surface covering the insulation layer and contacting the source contact plug whereby the resistance-reduction conductive layer having a greater area than a top surface of the contact metal plug for reducing a source-body resistance. In a preferred embodiment, the method further includes a step of manufacturing the hybrid semiconductor power device as a N-channel MOSFET cell. In a preferred embodiment, the method further includes a step of manufacturing the hybrid semiconductor power device as a P-channel MOSFET cell. In a preferred embodiment, the method further includes a step of manufacturing the stripe cell as a stripe AccuFET cell.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 1A and 1B are respectfully a top view and a cross sectional view of a related MOSFET cell configuration to reduce the distance between the source contacts as disclosed in a related Patent Application of this invention by the Applicant of this invention.

FIGS. 2A and 2B are respectfully a top view and a cross sectional view of a first embodiment for providing a hybrid MOSFET configuration of the present invention.

FIG. 5C' is a side cross sectional view for showing an alternate processing step instead of FIG. 5C for fabricating a MOSFET device as shown in FIGS. 4A to 4B.

DETAILED DESCRIPTION OF THE PREFERRED EMBODIMENT

Figure 1B:
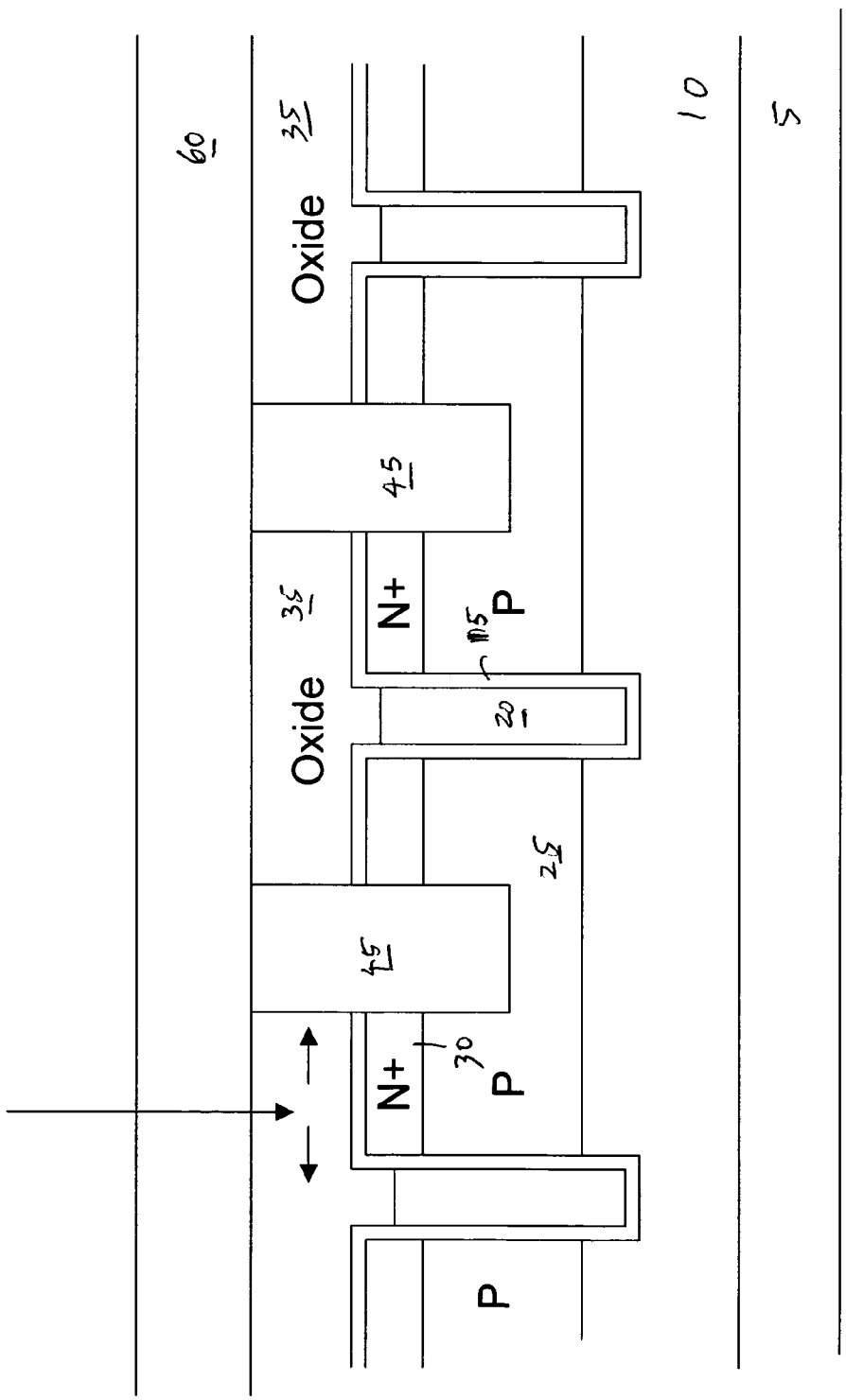
Figure 2A:
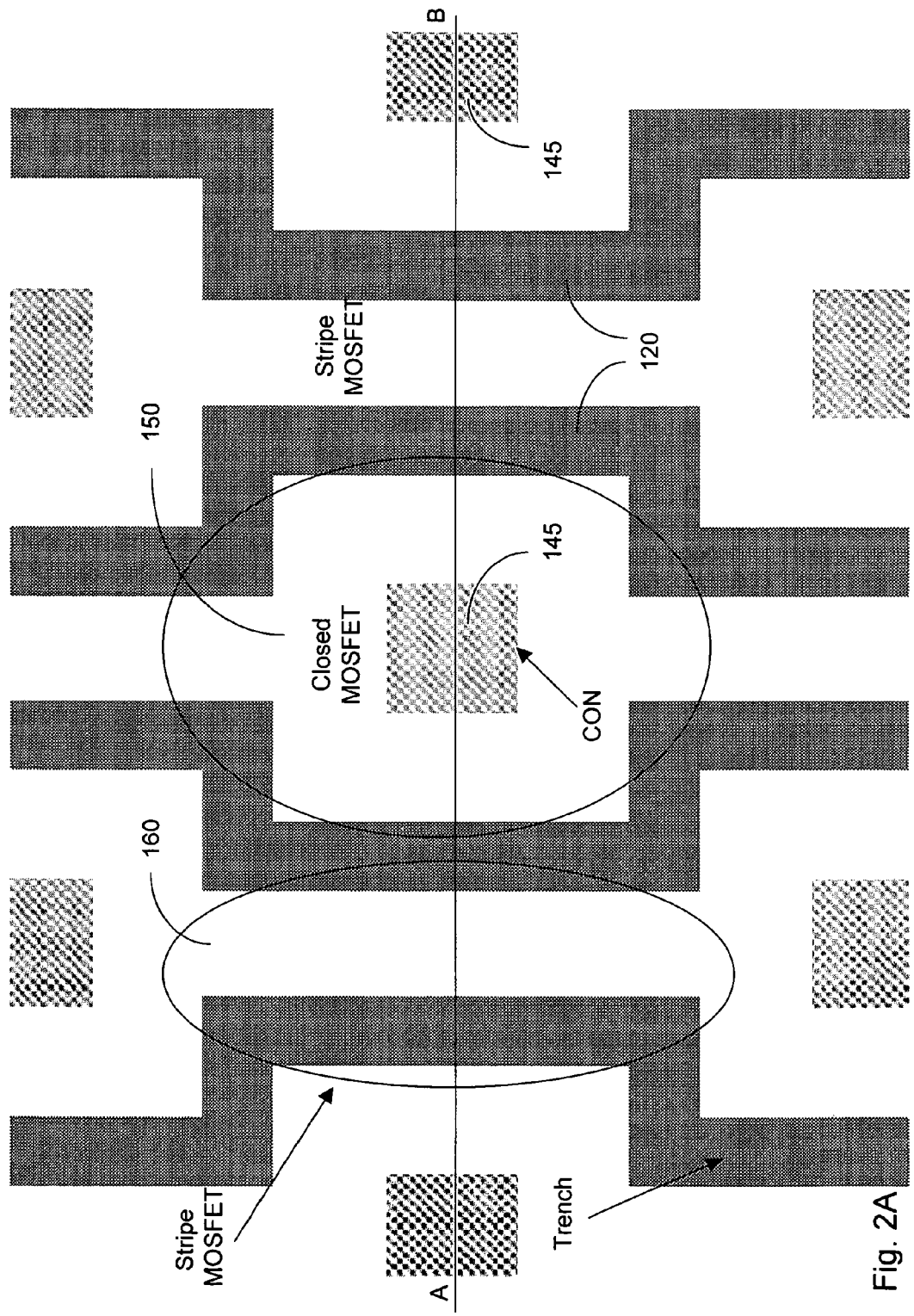

Please refer to FIGS. 2A to 2B for a first preferred embodiment of this invention where a metal oxide semiconductor field effect transistor (MOSFET) device 100 is supported on a substrate 105 formed with an epitaxial layer 110. The MOSFET device 100 includes a trenched gate 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 120. The top surface of the semiconductor substrate extending over the top of the trenched gate, the P body regions 125 and the source regions 130 are covered with a NSG and a BPSG protective layers 135. A source metal layer 140 and gate metal layer (not shown) are formed on top of the protective insulation layer 135.

For the purpose of improving the source contact to the source regions 130, a plurality of trenched source contact filled with a tungsten plug 145 that is surrounded by a barrier layer Ti/TiN. The contact trenches are opened through the NSG and BPSG protective layers 135 to contact the source regions 130 and the P-body 125. Then a conductive layer with low resistance (not shown) is formed over the top surface to contact the trenched source contact 145. A top contact layer 140 is then formed on top of the source contact 145. The top contact layer 140 is formed with aluminum, aluminum-cooper, AlCuSi, or Ni/Ag, Al/NiAu, AlCu/NiAu or AlCuSi/NiAu as a wire-bonding layer. The low resistance conductive layer (not shown) sandwiched between the top wire-bonding layer 140 and the top of the trenched source-plug contact 145 is formed to reduce the resistance by providing greater area of electrical contact.

In order to further increase the cell density without being limited by the critical dimension (CD) between the source contact 145 and the trenched gate 120, the MOSFET device 100 implements a new and improved hybrid cell configuration. The MOSFET device comprises hybrid MOSFET cells that include a plurality of closes MOSFET cell 150 and stripe MOSFET cell 160. The closed MOSFET cell is enclosed on substantially four sides by trenched gate 120 and the cell is configured substantially as a square cell wherein the distance between the source contact 145 to the trenched gate 120 complies with the critical dimension (CD) requirements. The stripe cells 160 are configured as elongated stripes situated and extended between two trenched gates 120. All the source contacts 145 disposed in the source-body contact trenches are placed at a CD distance away from the trenched gates 120 while the cell density is increased. The channel length per unit area increases from 2.2/um (500 M/in2 closed cell) to 2.6/um (hybrid 500 M/in2 for the closed cell and +2.5 G/in2 for the Stripe cells). The resistance Rds is further reduced because of the increase of channel length.

Figure 3:
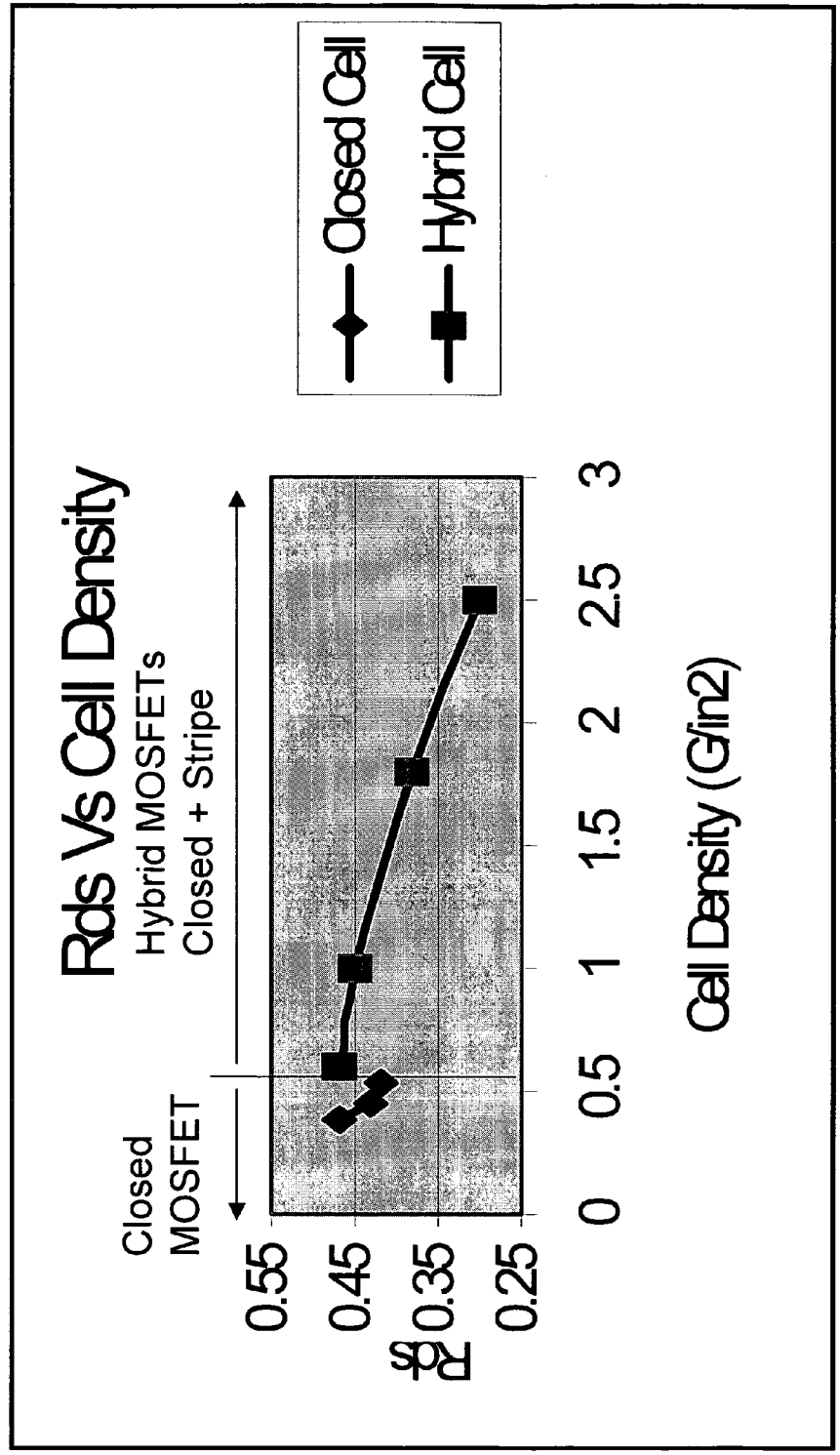
FIG. 3 is a diagram for showing and comparing the measurement data of the drain-to-source resistance Rds versus cell density of a closed MOSFET cell and a Hybrid MOSFET of this invention.

FIG. 3 is a diagram for showing the resistance measurements of the drain-to-source resistance versus the cell density for the traditional closed MOSFET configuration and the hybrid MOSFET configuration that includes the closed MOSFET and stripe MOSFET. Clearly, the hybrid configuration of this invention achieves higher cell density with lower drain-to-source resistance Rds. The hybrid cell configuration can increase the cell density to 2.5 G/in$^2$ compared with a cell density of approximately 600 million cells per square inch. The drain to source resistance Rds is also reduced from 0.40 ohm to 0.30 ohm. The measurement of the Rds reduction as shown in the diagram is analytically compatible with the above calculation of the increase of the channel length increase per unit area.

Figure 4A:
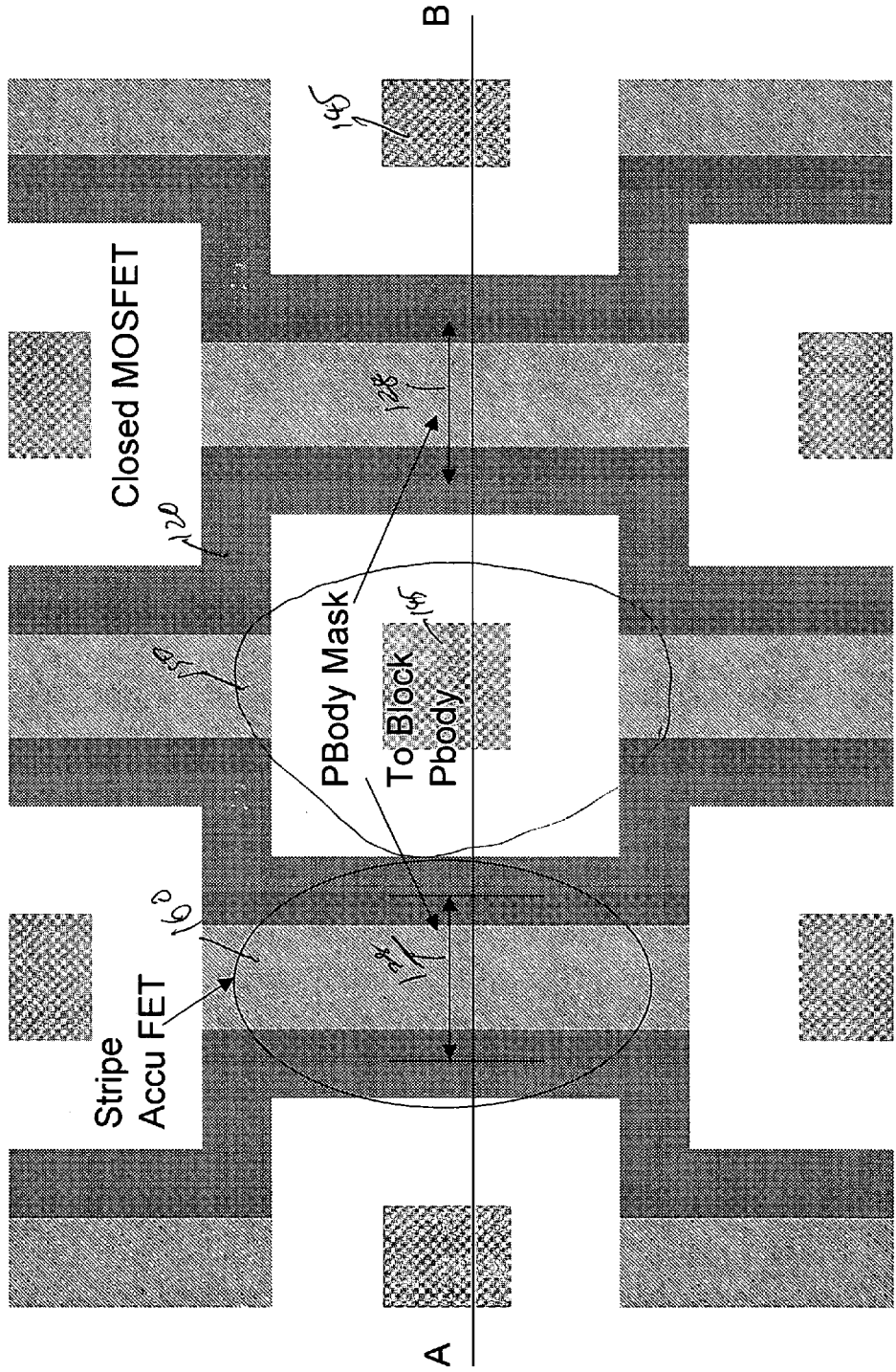
FIGS. 4A and 4B are respectfully a top view and a cross sectional view of a second embodiment for providing a hybrid MOSFET configuration of the present invention.
Figure 4B:
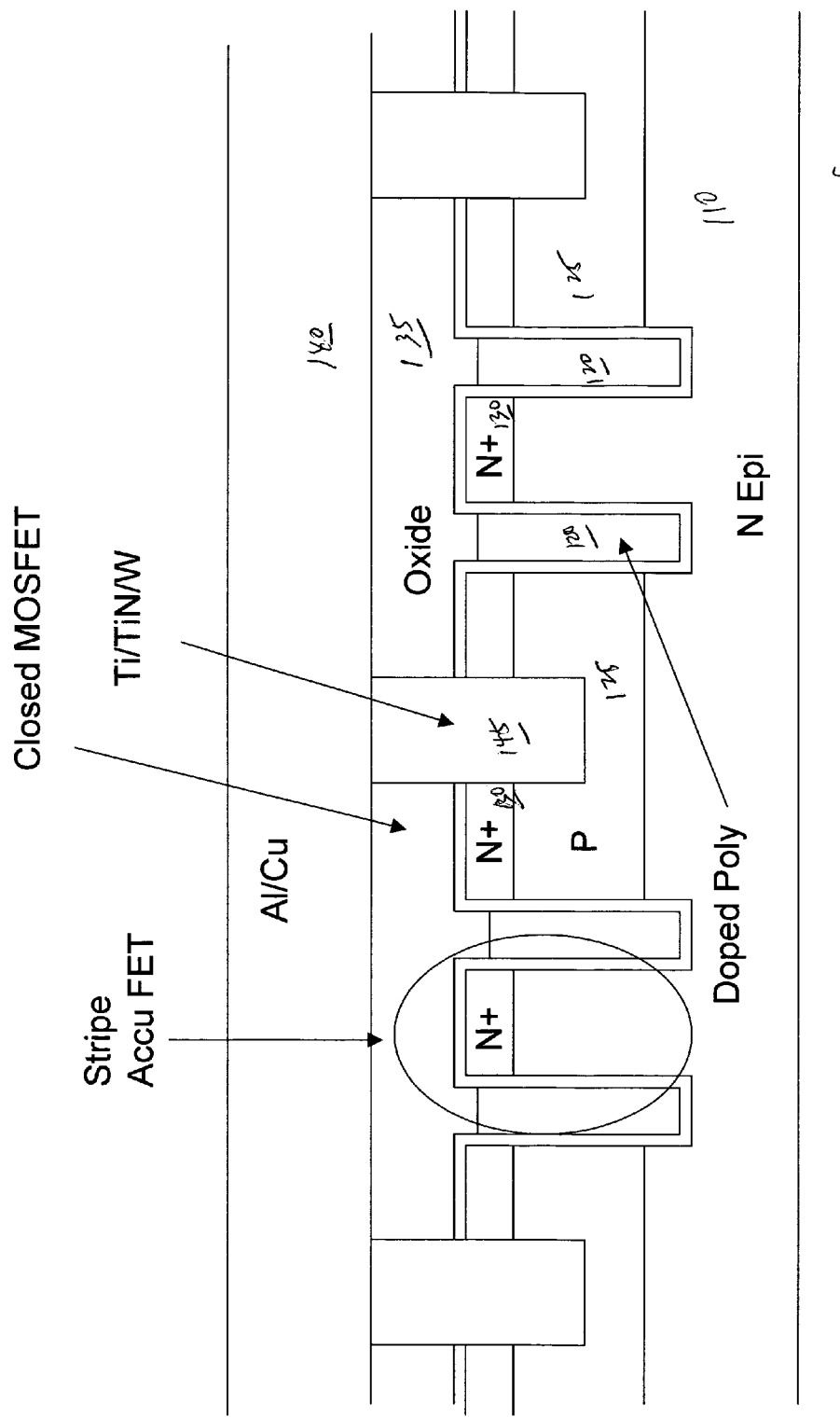

Referring to FIGS. 4A and 4B for an alternate embodiment of a MOSFET device implemented with another hybrid cell configuration of this invention. The hybrid MOSFET device 100' is similar to that shown in FIGS. 2A and 2B except that the distribution of the body regions is different. During the body dopant implant process, a body mask 128 is placed on top of the trenched gate surrounding the stripe cells 160 such that the p-body region is not formed below the source regions in the stripe cells 160 thus forming the stripe accumulation mode field effect transistor (accuFET) cells. The accuFET is accumulation-mode MOSFET, which does not have channel length since there is no P-body between two trench regions. The N+ current conduction path in AccuFET is formed along trench sidewalls induced by positive poly gate bias. The conduction path resistance in the AccuFET is about 100 times lower than that in conventional enhanced-mode MOSFET with P-body between two trenched regions. The conduction path in the enhanced-mode MOSFET is formed by inverting P-body along trench sidewall into N region induced by positive gate bias. The benefit of AccuFET is to immensely reduce Rds without significantly increasing reverse drain-source current in the narrow stripe cell area (less than 0.5 um) as the result of electrical field pinch effect during the reverse drain-source bias. The Hybrid AccuFET cell configuration disclosed in the present invention, which has remote source metal contact that shares the same contacts with the neighboring hybrid closed cells, is different from conventional AccuFET. The conventional AccuFET has direct source contact to the AccuFET as was disclosed by B. J. Baliga et al., "The Accumulation-Mode Field-Effect Transistor; A New Ultra On-resistance MOSFET" IEEE Electron Device Letters, Vol. 13, No. 8, August 1992, pp. 427-429. Therefore, this invention further disclose a semiconductor power device that includes an accumulation mode field effect transistor (AccuFET) cell without a direct source contact the said AccuFET cell and sharing a source contact with a neighboring cell such as a semiconductor power transistor or other types of semiconductor circuits.

Figure 5A:
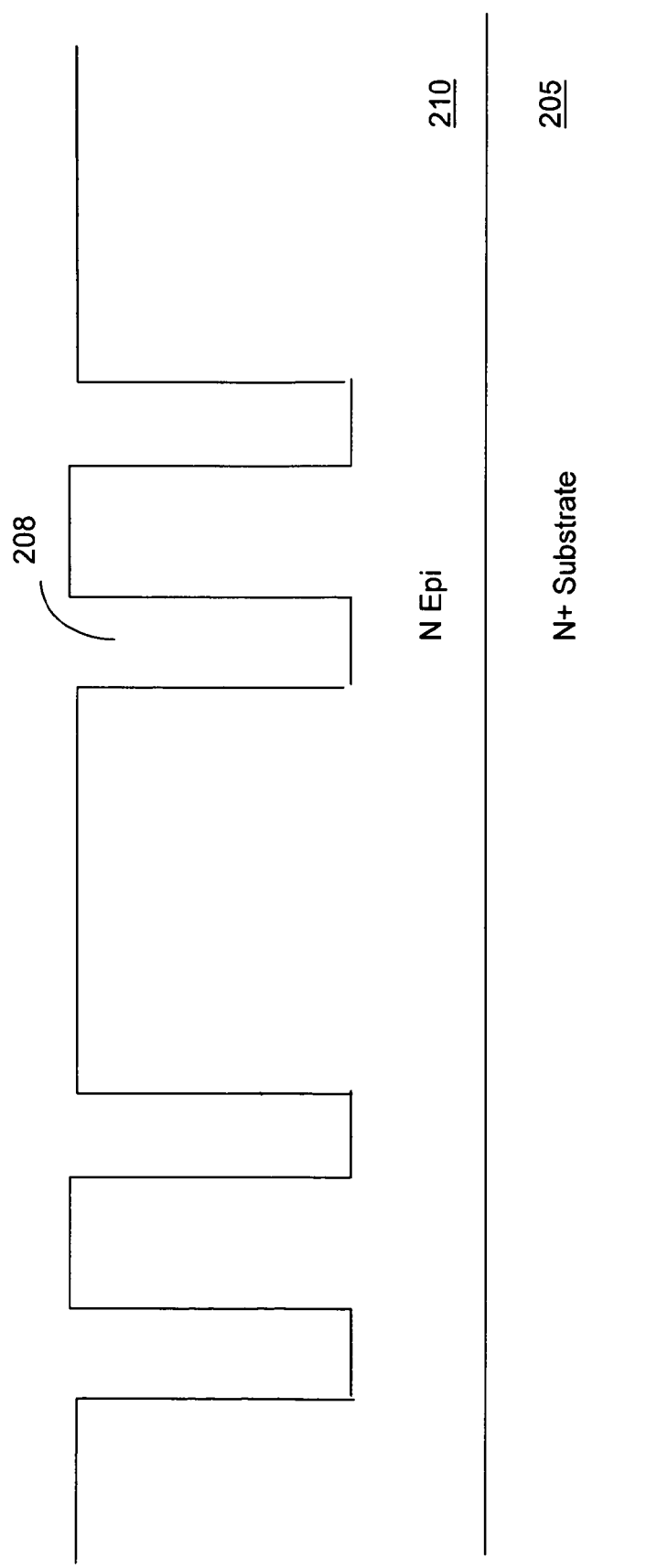
FIGS. 5A to 5E are a serial of side cross sectional views for showing the processing steps for fabricating a MOSFET device as shown in FIGS. 2A to 2B.
Figure 5B:
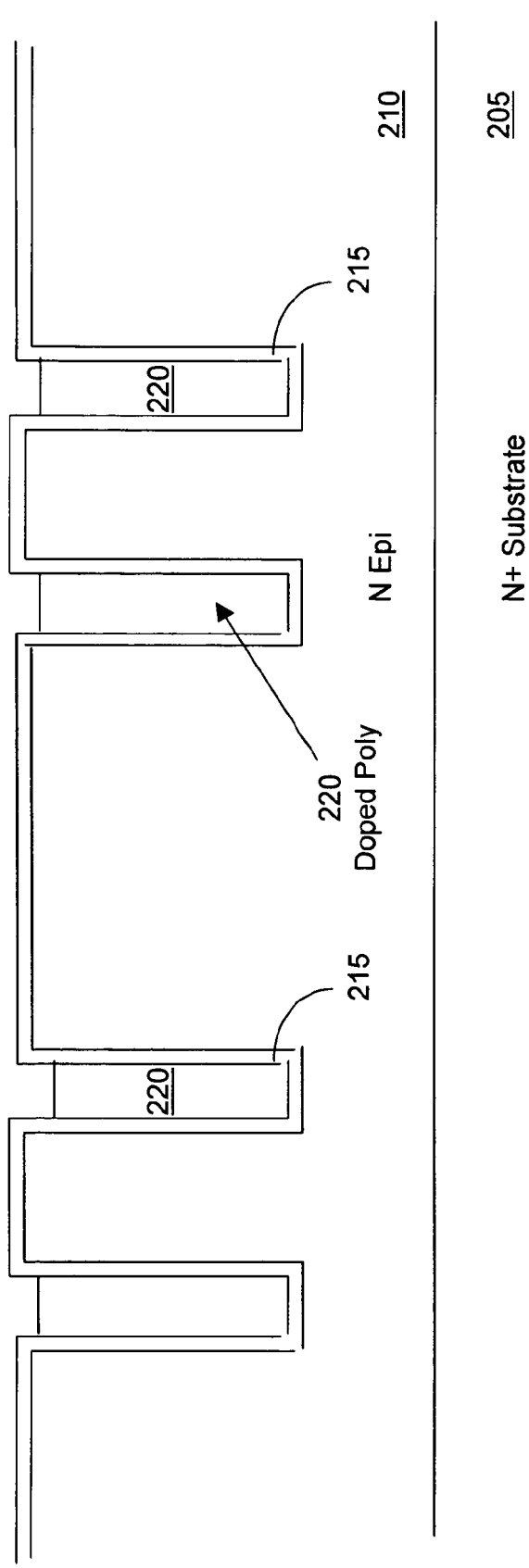
Figure 5C:
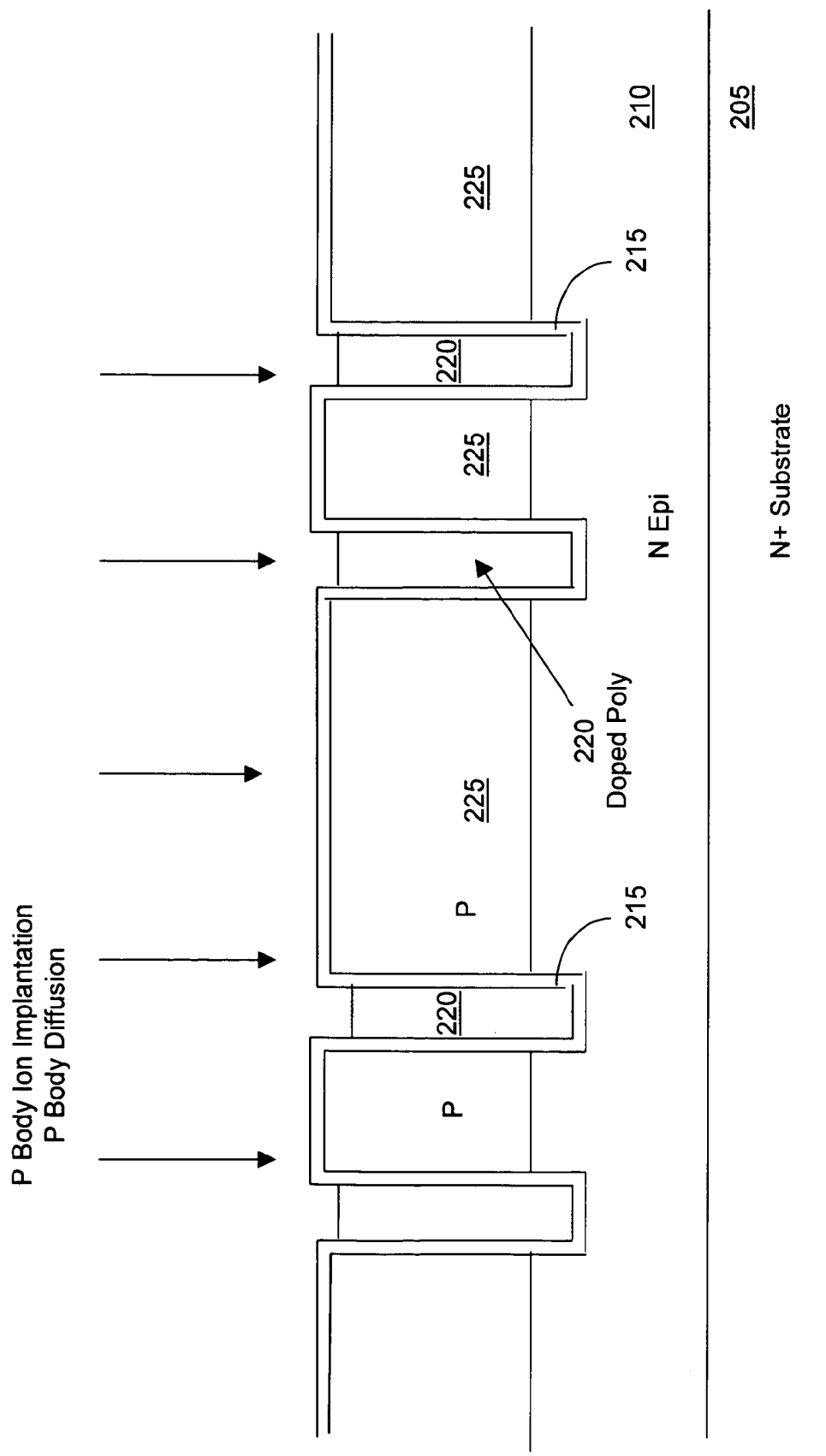
Figure 5C:
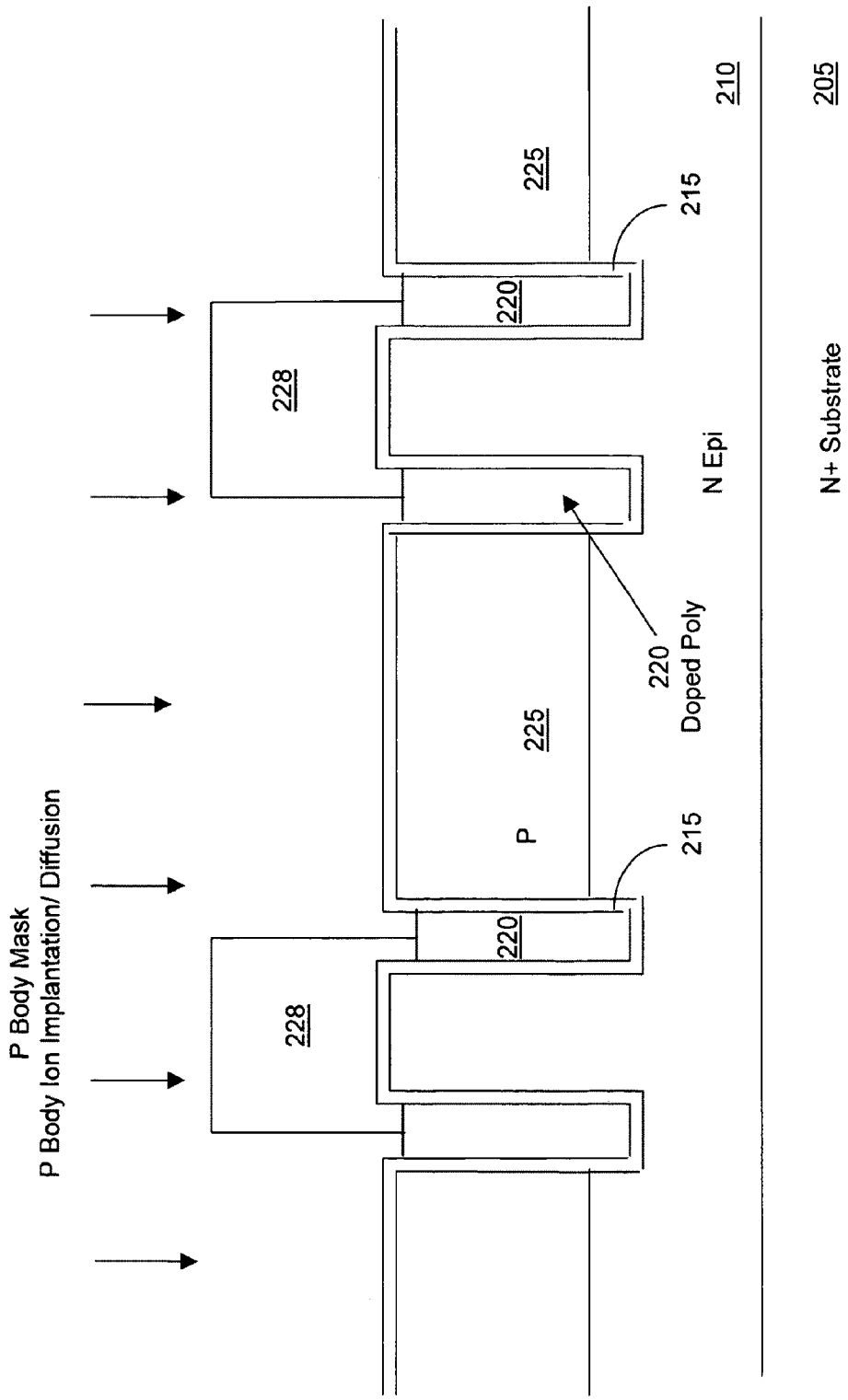
Figure 5D:
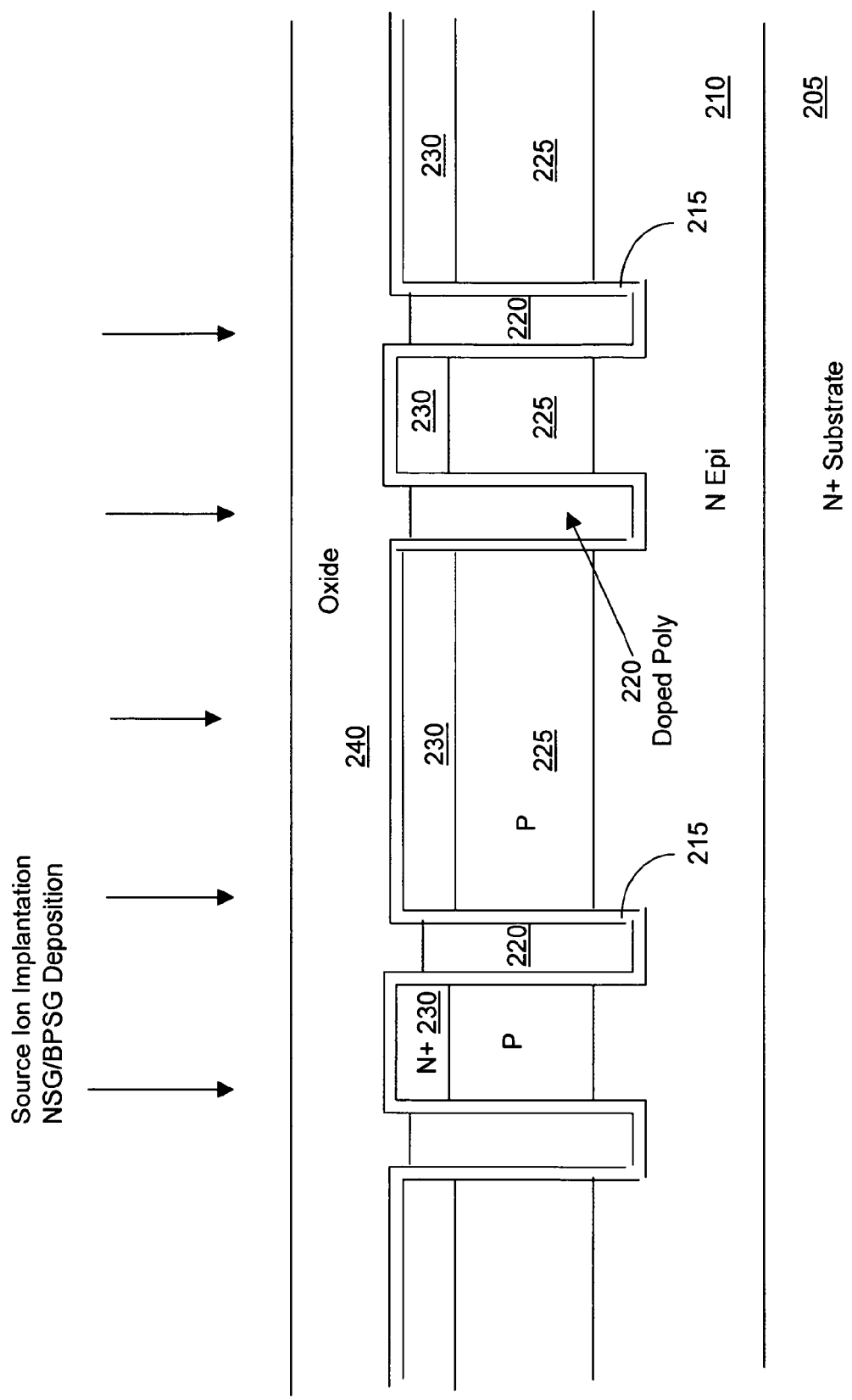
Figure 5E:
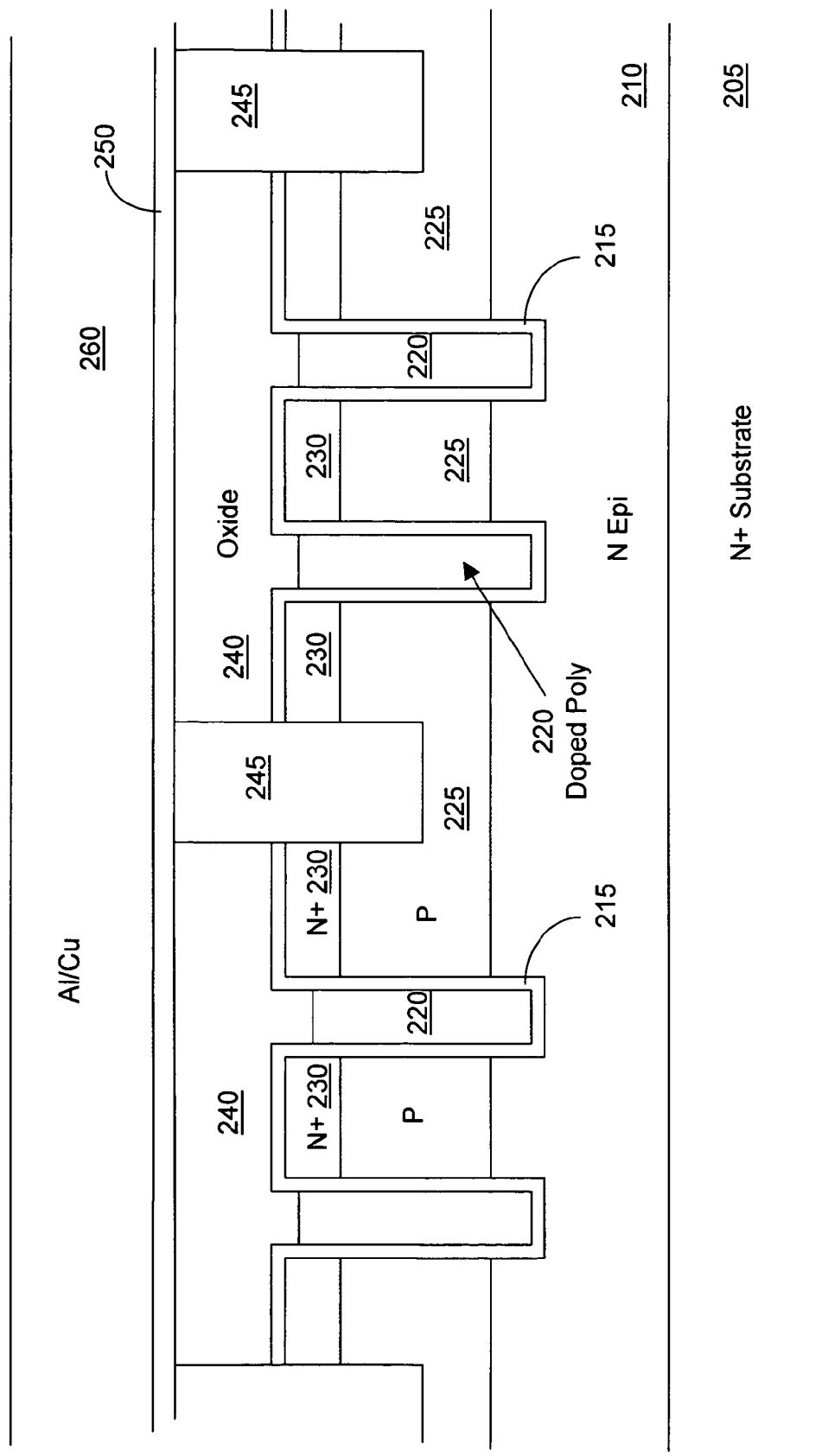

Referring to FIGS. 5A to 5E for a serial of side cross sectional views to illustrate the fabrication steps of a MOSFET device as that shown in FIGS. 2A to 2B. In FIG. 5A, a trench mask (not shown) is applied to open a plurality of trenches 208 in an epitaxial layer 210 supported on a substrate 205. In FIG. 5B, an oxidation process is performed to form an oxide layer covering the trench walls. The trench is oxidized with a sacrificial oxide to remove the plasma damaged silicon layer during the process of opening the trench. Then an oxide layer 215 is formed followed by depositing a polysilicon layer 220 to fill the trench and covering the top surface and then doped with an N+ dopant. The polysilicon layer 220 is etched back. In FIG. 5C, the manufacturing process is followed by a P-body implant with a P-type dopant. Then an elevated temperature is applied to diffuse the P-body 225 into the epitaxial layer 210. In FIG. 5D, a source mask (not shown) is first applied followed by a source implant with a N-type dopant. Then an elevated temperature is applied to diffusion the source regions 230. A non-doped oxide (NSG) layer and a BPSG layer 240 are deposited on the top surface. In FIG. 5E, contact mask is applied to carry out a contact etch to open the source-body contact trenches 245 by applying an oxide etch through the BPSG and NSG layers 240 followed by a silicon etch to open the contact openings further deeper into the source regions 230 and the body regions 225. The MOSFET device thus includes a source-body contact trench that has an oxide trench formed by first applying an oxide-etch through the oxide layers, e.g., the BPSG and NSG layers. The source-body contact trenches further include a silicon trench formed by applying a silicon-etch following the oxide-etch. The oxide etch and silicon etch may be a dry oxide and silicon etch whereby a critical dimension (CD) of the source-body contact trench is better controlled. The source-body contact trenches are then filled with a Ti/TiN/W layer 245. A low resistance conductive layer 250 is formed on top to cover the oxide layer 240 and also to contact the source body contact layer 245 to increase the current conduction areas to reduce the contact resistance. The low resistance metal layer 250 deposited over the top surface may be composed of Ti/AlCu or Ti/TiN/AlCu to assure good electric contact is established. Then a top metal conductive layer composed of Al/Cu is deposited and followed by a metal etch to pattern the metal layer into a source metal pad 260.

Referring further to FIG. 5C' for an alternate process to form the AccuFET cell configuration shown in FIGS. 4A and 4B. A P-body mask 228 is applied to cover the top area of between the trenched gates 220. The P-body regions 225 are therefore only formed in the closed MOSFET cells and not in the stripe cells thus forming the AccuFET cells shown in FIGS. 4A and 4B.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A hybrid metal oxide semiconductor field effect transistor (MOSFET) device comprising:
    a closed MOSFET cell surrounded by a first and second trenched gates constituting substantially a square cell with said first and second trenches separated with a narrow distance to leave a first and a second open ends on two opposite sides of said square cell and said first and second trenched gates further extending from said first and second open ends with said narrow distance between the first and second extended trenched gates substantially in parallel for constituting a first and second elongated stripe MOSFET cells extended from said two opposite sides of said substantially square cell whereby forming said hybrid MOSFET device with said square MOSFET cells hybrid with said elongated strip MOSFET cells.

2. The MOSFET device of claim 1 wherein:
    said closed MOSFET cell further comprising a source contact disposed substantially at a center portion of said square cell wherein said first and second trenched gate maintaining a critical distance (CD) away from said source contact.

3. The MOSFET device of claim 2 wherein:
said source contact further constituting a trenched source contact comprising a source contact plug filling in a source-body contact trench opened in an insulation layer covering said closed MOSFET cell and said source-body contact trench further extended into a source region below said insulation layer and a body region below said source region extended. between said first and second trenched gates of said closed MOSFET cell.

4. The MOSFET device of claim 3 further comprising:
a source metal layer disposed above sad insulation layer and electrically contact said source contact plug.

5. The MOSFET device of claim 3 wherein:
the source contact plug further comprising a Ti/TiN barrier layer surrounding a tungsten core as a source-body contact metal.

6. The MOSFET device of claim 3 further comprising:
a thin resistance-reduction conductive layer disposed on a top surface covering said insulation layer and contacting said source contact plug whereby said resistance-reduction conductive layer having a greater area than a top surface of said contact metal plug for reducing a source-body resistance.

7. The MOSFET device of claim 6 wherein:
said thin resistance-reduction conductive layer comprising a titanium (Ti) layer.

8. The MOSFET device of claim 6 wherein:
said thin resistance-reduction conductive layer comprising a titanium nitride (Ti/TiN) layer.

9. The MOSFET device of claim 3 wherein:
said source contact plug filled in said source body contact trench comprising a substantially cylindrical shaped plug.

10. The MOSFET device of claim 9 further comprising:
a thick front metal layer disposed on top of said resistance-reduction layer for providing a contact layer for a wire or wireless bonding package.

11. The MOSFET device of claim 10 wherein:
said front thick metal layer comprising an aluminum layer.

12. The MOSFET device of claim 10 wherein:
said front thick metal layer comprising an AlCu layer.

13. The MOSFET device of claim 10 wherein:
said front thick metal layer comprising an AlCuSi layer.

14. The MOSFET device of claim 10 wherein:
said front thick metal layer comprising an Al/NiAu layer.

15. The MOSFET device of claim 10 wherein:
said front thick metal layer comprising an AlCu/NiAu layer.

16. The MOSFET device of claim 10 wherein:
said front thick metal layer comprising an AlCuSi/NiAu layer.

17. The MOSFET device of claim 10 wherein:
said front thick metal layer comprising an NiAg layer.

18. The MOSFET device of claim 10 wherein:
said front thick metal layer comprising an NiAu layer.

19. The MOSFET device of claim 2 further comprising:
a drain electrode disposed below said body region for transmitting a source to drain current.

20. The MOSFET device of claim 1 wherein:
said stripe cell further comprising a stripe AccuFET cell.

21. The MOSFET device of claim 1 wherein:
said MOSFET cell further comprising a N-channel MOSFET cell.

22. The MOSFET device of claim 1 wherein:
said MOSFET cell further comprising a P-channel MOSFET cell.

23. A hybrid semiconductor power device comprising:
a plurality of closed power transistor cells each surrounded by a first and second trenched gates constituting substantially a closed cell with said first and second trenches separated with a narrow distance to leave a first and a second open ends on two opposite sides of said square cell and said first and second trenched gates further extending from said first and second open ends with said narrow distance between the first and second trenched gates thus constituting a plurality of elongated stripe cells extended from said two opposite sides of said substantially square cell whereby forming a hybrid configuration with said square cells and elongated strip cells.

24. The hybrid semiconductor power device of claim 23 wherein:
said closed MOSFET cell further comprising a source contact disposed substantially at a center portion of said closed cell wherein said trenched gates maintaining a critical distance (CD) away from said source contact.

25. The hybrid semiconductor power device of claim 24 wherein:
said source contact further constituting a trenched source contact comprising a source contact plug filling in a source-body contact trench opened in an insulation layer covering said closed cell and said source-body contact trench further extended into a source region below said insulation layer and a body region below said source region extended between said first and second trenched gates of said closed cell.

26. The hybrid semiconductor power device of claim 25 wherein:
the source contact plug further comprising a Ti/TiN barrier layer surrounding a tungsten core as a source-body contact metal.

27. The hybrid semiconductor power device of claim 25 further comprising:
a thin resistance-reduction conductive layer disposed on a top surface covering said insulation layer and contacting said source contact plug whereby said resistance-reduction conductive layer having a greater area than a top surface of said contact metal plug for reducing a source-body resistance.

28. The hybrid semiconductor power device of claim 24 further comprising:
a source metal layer disposed above sad insulation layer and electrically contact said source contact plug.

29. The hybrid semiconductor power device of claim 23 further comprising:
a drain electrode disposed below said body region for transmitting a source to drain current.

30. The hybrid semiconductor power device of claim 23 wherein:
said hybrid semiconductor power device further comprising a N-channel MOSFET cell.

31. The hybrid semiconductor power device of claim 23 wherein:
said hybrid semiconductor power device further comprising a P-channel MOSFET cell.

32. The hybrid semiconductor power device of claim 23 wherein:
said stripe cell further comprising a stripe AccuFET cell.

33. A semiconductor power device comprising:
a plurality of substantially closed cells and stripe cells constituting hybrid cell configuration with said stripe cells extending from four sides of said closed cell and four of said stripe cells surrounding and forming said closed cells wherein said stripe cells constituting an accumulation mode field effect transistor (AccuFET) cell; and a source contact disposed substantially in a middle portion of said closed cells whereby said stripe cells constituting said AccuFET cells electrically connecting to said source contact through said closed cells adjacent to the stripe cells and having no direct source contact in said AccuFET cell and sharing a source contact with said closed cells as a neighboring cells.

* * * * *